US009800434B2

(12) United States Patent
Ding et al.

(10) Patent No.: US 9,800,434 B2
(45) Date of Patent: Oct. 24, 2017

(54) MILLIMETER WAVE PHASE SHIFTERS USING TUNABLE TRANSMISSION LINES (71) Applicant: INTERNATIONAL BUSINESS MACHINES CORPORATION, Armonk, NY (US)

(72) Inventors: Hanyi Ding, Colchester, VT (US); Alberto Valdes Garcia, Hartsdale, NY (US); Wayne H. Woods, Jr., Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 479 days.

(21) Appl. No.: 13/867,433

(22) Filed: Apr. 22, 2013

(65) Prior Publication Data

US 2014/0315500 A1 Oct. 23, 2014

(51) Int. Cl.
| H04B 1/40 | (2015.01) |
| H04L 25/02 | (2006.01) |
| H01P 1/18 | (2006.01) |
| H01R 43/00 | (2006.01) |
| H03K 17/687 | (2006.01) |
| G06F 17/50 | (2006.01) |

(52) U.S. Cl.
CPC .......... *H04L 25/0278* (2013.01); *H01P 1/182* (2013.01); *H01P 1/184* (2013.01); *H01R 43/00* (2013.01); *H03K 17/687* (2013.01); *H04L 25/0272* (2013.01); *G06F 17/50* (2013.01)

(58) Field of Classification Search
CPC . H04B 1/40; H01P 1/184; H01P 1/182; H04L 25/0278; H04L 25/0272

USPC .............................................. 455/77, 87, 91
See application file for complete search history.

(56) References Cited

U.S. PATENT DOCUMENTS

| 6,356,166 B1 | 3/2002 | Goldsmith et al. |
| 7,259,640 B2 | 8/2007 | Brown et al. |
| 7,265,719 B1 | 9/2007 | Moosbrugger et al. |
| 7,492,325 B1 | 2/2009 | Moosbrugger et al. |
| 7,692,516 B2 | 4/2010 | Kim et al. |
| 8,193,878 B2 * | 6/2012 | Ding ........................ H01P 1/184 333/161 |
| 8,476,988 B2 * | 7/2013 | Ding ................... H01L 23/5222 333/164 |

(Continued)

OTHER PUBLICATIONS

Phillip Restle et al., Dealing with Inductance in High-Speed Chip Design, Proceedings 1999 Design Automation Conference, New Orleans, LA, Jun. 1999, pp. 904-909.

(Continued)

*Primary Examiner* — MD Talukder
(74) *Attorney, Agent, or Firm* — Tutanjian & Bitetto, P.C.; Steven Meyers (57) ABSTRACT Tunable phase shifters and methods for using the same include a signal line; one or more grounding lines; one or more crossing lines below the signal line in proximity to the signal line and substantially perpendicular to a longitudinal direction of the signal line, where the crossing lines conform to the shape of the signal line along at least three surfaces of the signal line and where the crossing lines have a tunable capacitance; and an inductance return line below the crossing lines substantially parallel to the longitudinal direction of the signal line, where the inductance return line provides a tunable inductance.

16 Claims, 7 Drawing Sheets

(56) References Cited

U.S. PATENT DOCUMENTS

| | | | | |
|---|---|---|---|---|
| 8,665,040 | B1* | 3/2014 | Chappell | H01P 1/2039 333/174 |
| 2002/0192920 | A1* | 12/2002 | Song | B81B 7/0064 438/381 |
| 2003/0020173 | A1* | 1/2003 | Huff et al. | 257/774 |
| 2005/0253669 | A1* | 11/2005 | Tillery | 333/161 |
| 2006/0007423 | A1* | 1/2006 | Guruprasad | G01S 11/02 356/5.09 |
| 2007/0279880 | A1* | 12/2007 | Weir | H01L 23/66 361/794 |
| 2008/0048799 | A1* | 2/2008 | Wang | H01P 1/2039 333/156 |
| 2009/0010029 | A1* | 1/2009 | Mizukoshi | H02M 7/003 363/40 |
| 2009/0134953 | A1* | 5/2009 | Hunt et al. | 333/168 |
| 2009/0315633 | A1* | 12/2009 | Ding | H01L 23/5222 333/1 |
| 2009/0315641 | A1* | 12/2009 | Ding | H01P 1/184 333/161 |
| 2010/0141354 | A1 | 6/2010 | Cho | |
| 2010/0171567 | A1 | 7/2010 | Krishnaswamy et al. | |
| 2010/0214041 | A1* | 8/2010 | Cho | H01L 23/5225 333/238 |
| 2012/0102444 | A1 | 4/2012 | Ding et al. | |
| 2014/0285299 | A1* | 9/2014 | Bojer | H01F 21/02 336/105 |
| 2014/0315500 | A1* | 10/2014 | Ding | H01P 1/184 455/77 |
| 2015/0180439 | A1* | 6/2015 | Reiha | H01P 1/184 333/164 |
| 2015/0365259 | A1* | 12/2015 | Ding | H01P 1/184 375/257 |

OTHER PUBLICATIONS

Office Action for U.S. Appl. No. 14/835,286 dated Nov. 7, 2016, 12 pages.

* cited by examiner

FIG. 1

(PRIOR ART)

MILLIMETER WAVE PHASE SHIFTERS USING TUNABLE TRANSMISSION LINES

RELATED APPLICATION INFORMATION

This application is related to commonly assigned application, "MILLIMETER WAVE PHASE SHIFTERS USING TUNABLE TRANSMISSION LINES", Ser. No. 13/867,422, filed concurrently herewith and incorporated herein by reference.

BACKGROUND

Technical Field

The present invention relates to millimeter wave communication systems and, more particularly, to phase shifters for millimeter wave communication systems that make use of tunable transmission lines.

Description of the Related Art

Phase shifters are important components in any communication system. This is particularly true of phased array communication and radar systems, where gain may be improved by adjusting the phase shift for each of an array of antennas, such that gain is improved in a desired direction. However, existing phase shifters present challenges for use in millimeter wave (mmWave) systems.

Figure 1:
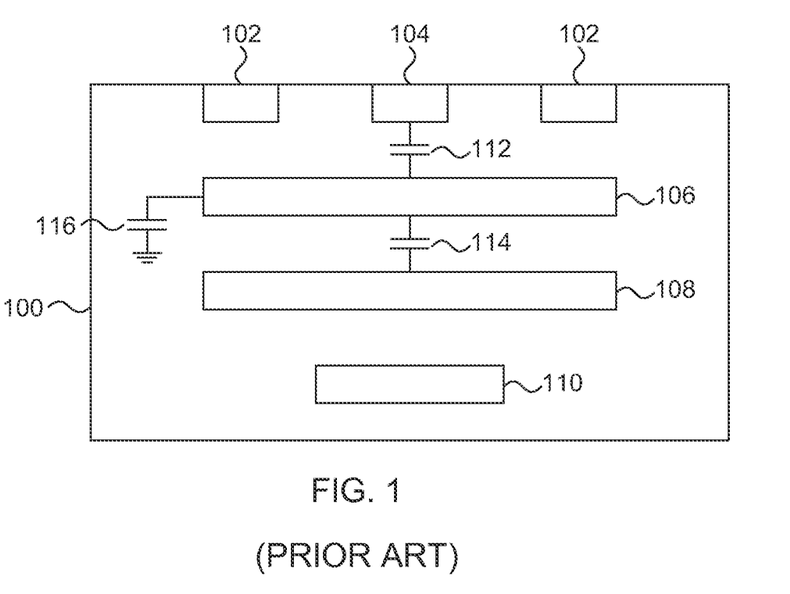
FIG. 1 is a cross-sectional view of a prior art phase shifter.

Referring now to FIG. 1, cross-sectional diagram of a prior art tunable transmission line is shown. The capacitance of this component can be adjusted to provide phase adjustments in a phase shifter. A chip 100 has a number of crossing transmission lines 106 and 108 perpendicular to and embedded under a signal line 104 and ground lines 102. A transistor's capacitance 116 provides a variable capacitance that allows tuning. In particular, the capacitances between the signal terminal 104 and the crossing lines 106, between the crossing lines 106 and the crossing lines 108, and between crossing lines 106 and ground determine the capacitative tuning range of the device.

Conventional phased array systems inherit the flaws of the phase shifters. Large phase shifters are spaced out on the chip, such that long transmission lines are needed to connect them to a power divider. As a result, the size and complexity of the device increases.

SUMMARY

A tunable phase shifter includes a signal line; one or more grounding lines; one or more crossing lines below the signal line in proximity to the signal line and substantially perpendicular to a longitudinal direction of the signal line, wherein the crossing lines conform to the shape of the signal line along at least three surfaces of the signal line and wherein the crossing lines have a tunable capacitance; and an inductance return line below the crossing lines substantially parallel to the longitudinal direction of the signal line, wherein the inductance return line provides a tunable inductance.

A transceiver includes one or more front ends configured to transmit and receive signals according to a beam direction; a power splitter/combiner configured to split a transmission signal to each of one or more front ends and to combine received signals from each of the one or more front ends; and one or more tunable transmission line phase shifters that communicate signals between respective front ends and the power splitter/combiner. Each tunable transmission line phase shifter includes a signal line; one or more grounding lines; one or more crossing lines below the signal line in proximity to the signal line and substantially perpendicular to a longitudinal direction of the signal line, wherein the crossing lines conform to the shape of the signal line along at least three surfaces of the signal line and wherein the crossing lines have a tunable capacitance; and an inductance return line below the crossing lines substantially parallel to the longitudinal direction of the signal line, wherein the inductance return line provides a tunable inductance.

A method for adjusting the phase shift of a tunable transmission line phase shifter includes adjusting a tunable capacitance of crossing lines that conform to a shape of a signal line along at least three surfaces of the signal line; and adjusting a tunable inductance in an amount proportional to the tunable capacitance, wherein adjusting the tunable capacitance and tunable inductance creates a target phase change and a change in a characteristic impedance of the tunable transmission line phase shifter of about zero.

A method for creating a tunable phase shifter includes setting physical dimension limits for the tunable phase shifter; determining electrical parameters for the tunable phase shifter, including a characteristic impedance limit and a maximum inductance tuning range, based on the physical dimension limits using a processor; and determining physical dimensions for an inductance tuning transistor and a capacitor tuning transistor, such that a characteristic impedance range is minimized.

A system for creating a tunable phase shifter includes a parameter module configured to set physical dimension limits for the tunable phase shifter and to determine electrical parameters for the tunable phase shifter, including a characteristic impedance limit and a maximum inductance tuning range, based on the physical dimension limits using a processor; and a field solver comprising a processor configured to determine physical dimensions for an inductance tuning transistor and a capacitor tuning transistor, such that a characteristic impedance range is minimized.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention provide tunable transmission lines that have high capacitance tuning ranges and are suitable for use in millimeter wave (mmWave) systems. To accomplish this, the present embodiments have transmission lines designed to provide capacitances more suitable to high tuning ranges. For example, whereas prior art phase shifters have a capacitance range of about 30%, embodiments of the present invention may have ranges many times larger. Embodiments of the present invention further provide methods for automating the design of such transmission lines, greatly reducing the design time for mmWave systems.

Implementing conventional phase shifters on integrated circuits imposes limitations on the size and type of components that may be used. For example, a reflection-type phase shifter will be passive and bi-directional and may have a good phase shift range, but such phase shifters are relatively large and have variable losses as the phase shift changes. An inductor-capacitor-based phase shifter will have a straightforward design but tuning is coarse and insertion loss tends to be high. Active phase shifters, meanwhile, use significant area, consume power, and degrade the system's noise factor.

The phase shifters of the present embodiments have controllable inductance and controllable capacitance, where the characteristic impedance of a section can vary the phase shift without significantly affecting the constant characteristic impedance. Maintaining this characteristic impedance means that the capacitive structures should not affect the inductance of the structure.

Existing tunable transmission line phase shifters suffer problems of their own. Such systems involve large capacitances between transmission lines and often require total isolations between paths. These implementations are difficult or impossible to use in mmWave, transistor-controlled circuits.

Figure 2:
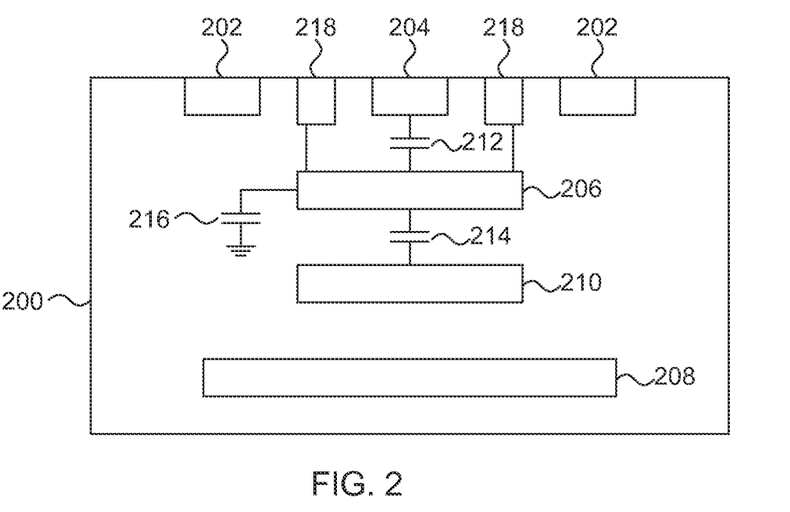
FIG. 2 is a cross-sectional view of a tunable transmission line phase shifter in accordance with the present principles.

Referring now to the drawings in which like numerals represent the same or similar elements and initially to FIG. 2, a cross-sectional diagram of a tunable transmission line is shown. A set of transmission lines are embedded in a chip or substrate. The chip may be a monolithic crystal or semiconductor-on-insulator substrate having the transmission lines formed thereon, or may simply be a multi-layer printed circuit board. A transistor provides a tunable capacitance 216 that allows for adjustment of the overall capacitance of the device. It should be noted that the tunable capacitance 216 is zero if the associated transistor is turned on and is non-zero when the capacitor is turned off.

Conditional capacitance crossing lines 206 are lines that cross orthogonally to the signal 204 and ground 202 return paths. Because they are primarily orthogonal to the signal 204 and ground 202 return paths, they do not significantly affect the line inductance. As will be described in greater detail below, the conditional capacitance crossing lines 206 can snake under the signal line so as to minimize long continuous conductor paths parallel to the signal and ground return paths, as such paths would affect inductance. A conditionally switched inductance return line 210 runs parallel to the signal line 204 and provides tunable inductance control for the tunable transmission line 200.

There can also be crossing lines 208 that are not conditionally switched. Crossing lines 208 do not affect inductance, but they can affect signal capacitance depending on where they are. For example, crossing lines 208 help to provide a common ground across ground lines 202 and also allows ground current to flow orthogonally across the phase shifter. This is helpful in mmWave designs that use low-level metals to form ground planes virtually everywhere else on the chip.

The present embodiments can be designed to produce a desired tuning range by adjusting the relative capacitance values 212 ($C_A$), 214 ($C_B$), and 216 ($C_{FET}$). The tuning range can be calculated based on these variables. The high end of the range $C_{HIGH}=C_A$. The low end, meanwhile, is determined as $C_{LOW}=C_A C_X/(C_A+C_X)$, where $C_X=C_{FET}+C_B$. The ratio of the high value to the low value is determined as $C_{HIGH}/C_{LOW}=(C_A+C_X)/C_X$. This ratio can therefore be set by tuning the relative value of $C_A$ and $C_X$. For example, if $C_X=3C_A$, then the ratio is 1.33 and the tuning range is 33%. If $C_X=0.5C_A$, then the ratio is 3 and the tuning range is 300%. Therefore, the higher $C_A$ is relative to $C_X$, the higher the tuning range will be.

To accomplish this end, the present embodiments select shapes for crossing lines 206 that conform more closely to the shape of signal line 204, increasing the associated capacitance $C_A$. This may be accomplished by, e.g., extending the crossing line 206 with crossing line extensions 218 on either side of the signal line 204. The precise structure of these crossing line extensions 218 may vary according to the design needs of the particular application. As will be shown below, the lines 206 and 218 may be combined into a single structure and may have a variety of contours that interface with corresponding contours of the signal line 204, providing the desired capacitance.

Figure 3:
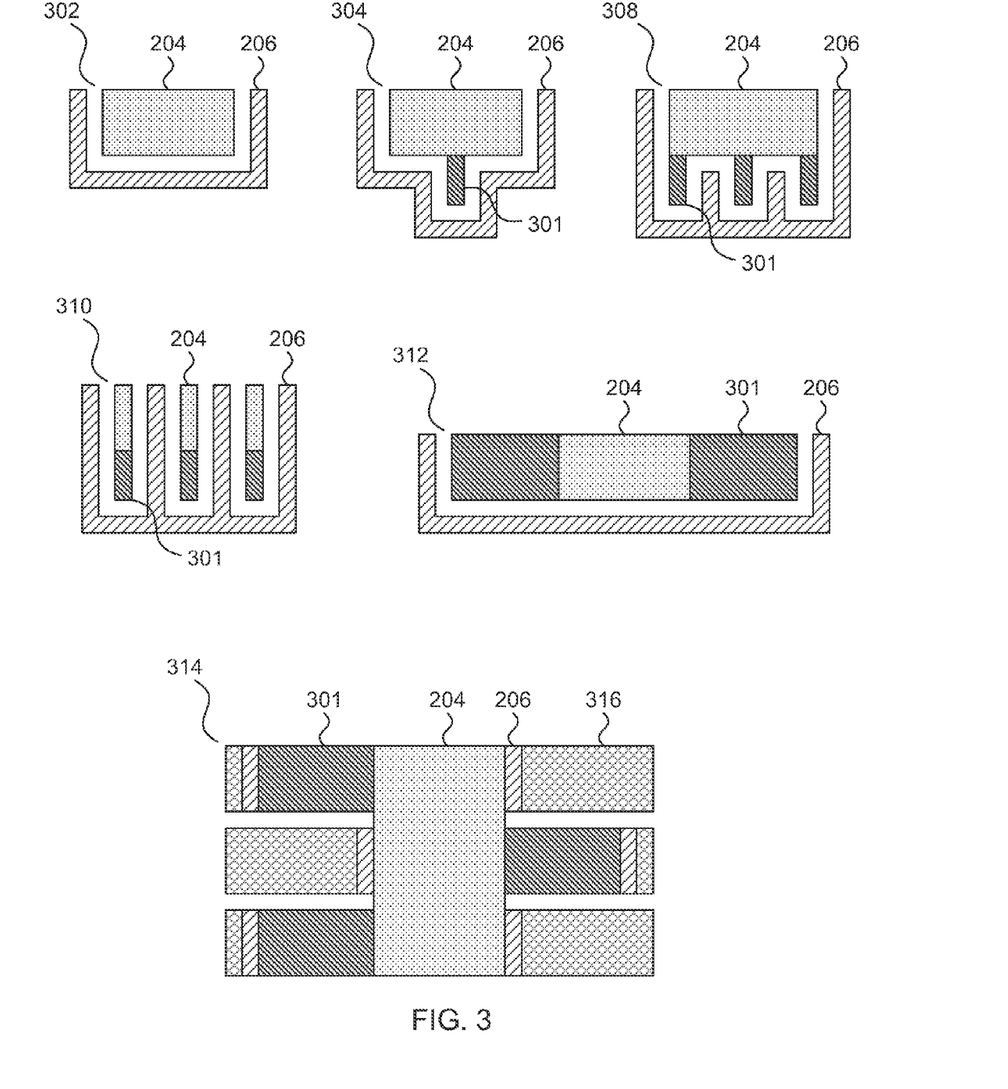
FIG. 3 is a set of cross-sectional views different signal line and crossing line embodiments in accordance with the present principles.

Referring now to FIG. 3, different variations on the capacitive interface between signal line 204 and conditional capacitance crossing lines 206 are shown. A first embodiment 302 shows the structure alluded to in FIG. 2, where the crossing line 206 are extended up and around the signal line 204. This increases the capacitive surface area beyond what would be available if the crossing line 206 only extended across one surface of the signal line 204.

A second embodiment 304 shows how the capacitance $C_A$ may be further increased. An additional conductor 301 is laid along with the signal line 204 that provides additional surface area. The crossing line 206 conforms to this protrusion from the signal line 204. Similarly, embodiment 308 shows that this design may be extended to multiple conductive extensions 301, allowing for arbitrarily high capacitances within the bounds of the fabrication technologies. The conductive extensions 301 to the signal line 204 are formed of via metal and a metal layer or layers below the signal line 204. In some embodiments, they may be the same material as the signal line 204, and in others they may be different. For example, in some manufacturing technologies the top layer is aluminum, while the other metal layers may be copper. Further, metal in vertical vias may be slightly different from the signal metal or any of the layers below. For example, extensions 301 could be made from tungsten.

Embodiment 310 shows the use of multiple signal lines 204, or one signal line that has been split into several for part of its length. Conductive extensions 301 may be included or not, and the crossing lines 206 extend up and between the signal lines 204. Again, this embodiment allows for arbitrarily high capacitances, as long as the fabrication technology is able to accurately divide the signal line 204 and form the crossing lines 206 between the divisions.

Embodiment 312 shows another type of conductive extension 301 for signal line 204, extending horizontally. This extension 301 linearly increases the capacitance between the signal line 204 and the crossing line 206. Embodiment 314 similarly projects the extensions 301 horizontally, but "interdigitates" the extensions 301 with extensions 316 of the crossing lines 206, such that the respective extensions alternate on either side of the signal line 204. In 314, the crossing lines 206 are visible in the gaps between crossing line extensions 316 and either the signal line 204 or the signal line extensions 301.

Figure 4:
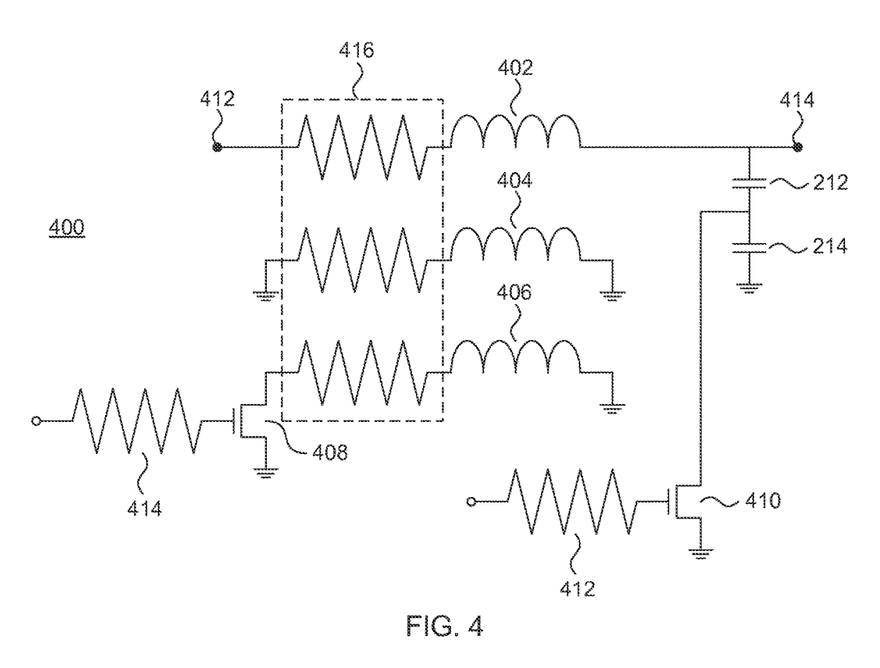
FIG. 4 is a schematic diagram of a tunable transmission line phase shifter in accordance with the present principles.

Referring now to FIG. 4, a schematic of a phase shifter 400 using the above-described tunable transmission line 200 is shown. An inductance 402 represents the self inductance of the signal line 204, an inductance 404 represents the self inductance of the ground lines 202, and an inductance 406 represents the self inductance of the inductance return line 210. Coupling inductances exist between these lines as well, with a mutual inductance between the signal line 204 and the inductance return line 210, a mutual inductance between the signal line 204 and the ground lines 202, and a mutual inductance between the ground lines 202 and the inductance return line 210. A tunable inductance is controlled by transistor 408. Capacitances 212 and 214 are as described above, and a transistor 410 controls the tunable capacitance 216.

Resistances 412 and 414 represent resistances that correspond to the inputs of transistors 410 and 408 respectively, and it is expected that those having ordinary skill in the art will be able to select resistances suitable for a given application. Resistances 416 represent the inherent resistances of the signal, ground, and inductance return lines and will be determined by their materials and geometries.

Maintaining the characteristic inductance of the phase shifter 400 is a significant consideration. If the inductance of the signal line were unimportant, then the capacitances could be changed in a direct fashion to vary the phase shift. However, when varying both the inductances and the capacitances, the phase shift range is substantially larger. Further, when only varying the capacitance, the characteristic impedance would be substantially reduced, causing excessive reflection loss due to characteristic impedance mismatch between the inputs and outputs of the phase shifter 400 and the rest of the circuit. This can be seen from the fact that the phase shift $\phi \sim \sqrt{LC}$, while the characteristic impedance $Z_0 \sim \sqrt{L/C}$. Clearly then, if both the inductance and the capacitance are changed proportionally, then the phase shift $\phi$ can be varied without affecting the characteristic impedance $Z_0$. As a result, careful control of the inductance is needed to make changes to the inductance proportional to the changes in the capacitance.

Figure 5:
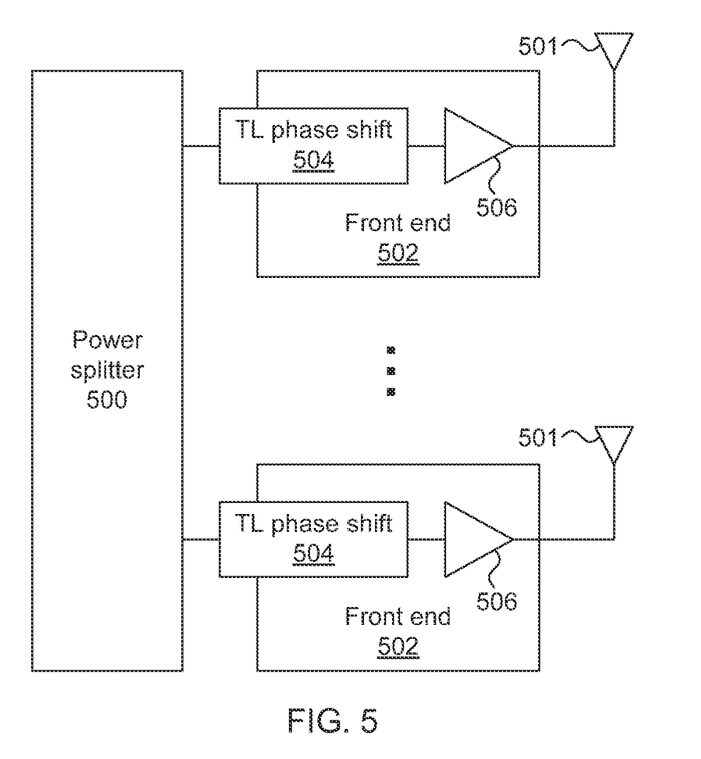
FIG. 5 is a diagram of a phased array transceiver including tunable transmission line phase shifters in accordance with the present principles.

Referring now to FIG. 5, part of an exemplary phased array transmitter is shown. A power splitter 500 receives a transmission signal and sends the signal to a set of front ends 502. In a phased array transmitter, each front end is associated with a respective antenna 501 and phase shifts its signal according to a desired beam direction. To accomplish this, a conventional front-end will have a transmission line that conveys the signal from the power splitter to the phase shifter. In the present embodiments, however, a tunable transmission line based phase shifter 504 is used to move the signal to the front end 502 and to perform the phase shift. This saves substantial space on the device, as it removes an entire component and makes effective use of transmission lines that are already present. The front end 502 then applies an appropriate amplification to the signal at variable amplifier 506, in accordance with a desired beam direction and power, before sending the signal to the antenna 501.

It is worth noting that the embodiments set forth in FIGS. 2 and 4 provide two contant-impedance states—one with the inductance transistor 408 and capacitance transistor 410 switched on, and one with them switched off. When used in practice, the tunable transmission line based phase shifter 504 may include several such structures, each providing a range of capacitance tuning.

Figure 6:
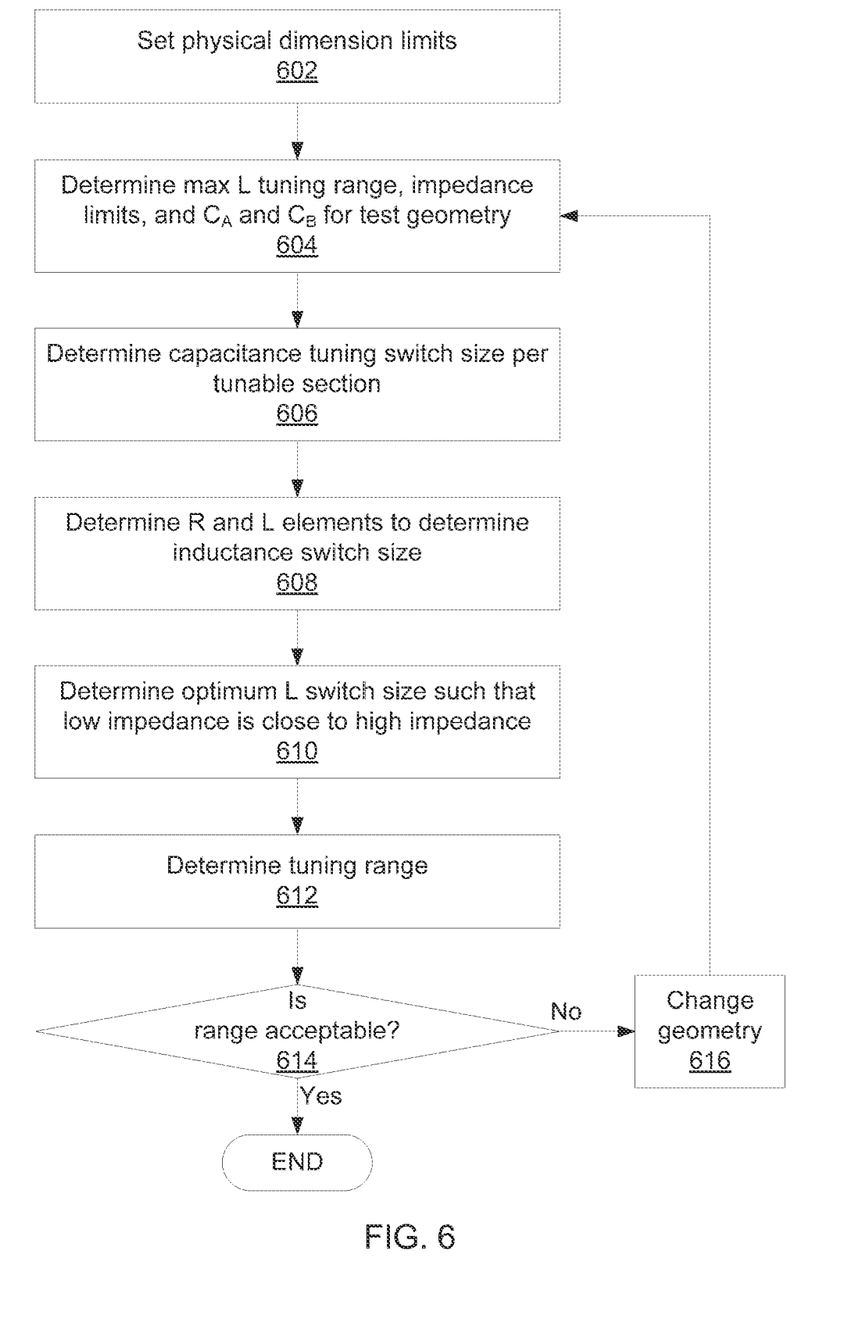
FIG. 6 is a block/flow diagram of a method for designing a tunable transmission line phase shifter in accordance with the present principles.

Referring now to FIG. 6, a block/flow diagram of a method for designing high-performance tunable transmission lines is shown. Using the methods described herein, a suitable transmission line can be designed automatically, saving a substantial amount time over design by iterative manual tweaks. Block 602 sets the physical limits for the dimensions of the device. These dimensions include, e.g., widths, lengths, spacing design rules, vertical separations, number of metal layers, etc. Specific quantities can include the width of the signal line 204, width of the ground lines 202, spacing between the signal and ground lines, the width of the crossing lines, etc. Block 602 thereby sets the physical parameters of the problem.

Block 604 determines a number of test parameters to use in generating a simulated tunable transmission line. These test parameters include a maximum inductor tuning range (determined by a high inductance and a low inductance), a characteristic impedance ($Z_0$) limit, and values for $C_A$ and $C_B$ using a field solver. The inductance tuning range represents a theoretical maximum based on geometry alone, without the influence of tuning transistor 408.

Block 604 uses detailed dielectric information regarding the back-end-of-line in capacitance simulations. In the case of determining the inductor tuning range, the cross-section geometry input is run through a two-dimensional field solver assigning the ground return paths as grounded conductors. The simulation outputs the inductance information of the signal conductors and any other conductors specified as being included as separate conductors. For example, the signal line 204 would be assigned the identifier "conductor 1" in the simulation, and both ground lines 202 would be "conductor 99". Just simulating these three conductors, even without any dielectrics present, would give a high range for the inductance. The same case may be simulated with the addition of an inductance return line 210 as another "conductor 99" to provide a low range for the inductance. Capacitance test cases follow a similar procedure but need detailed dielectric layers to be included in the back-end-of-line cross section.

Block 606 uses the target capacitance tuning range (e.g., a 100% tuning range) to determine physical properties for an optimum transistor that generates $C_{FET}$. Such properties may include the transistor width per tunable t-line section, and may employ known capacitance-per-width values for a given transistor. Using the equations set out above, block 606 determines a value for the transistor capacitance 216 that produces the desired range. The geometry of the transistor 410 is then determined using the known capacitance-per-width values.

Block 608 determines the resistor and inductor elements needed to complete the circuit in simulations. For a given geometry, block 608 uses the two-dimensional field solver to get all of the self-and mutual-inductances for the signal line 204, ground lines 202, and inductance return line 210, producing three unique mutual inductance terms and three self-inductance terms. The same simulation may then be used to determine the frequency-dependent resistances for the signal line 204, ground lines 202, and induction return line 210.

Block 610 simulates circuits using the above-determined circuit element values and an optimum capacitance-tuning transistor size to determine an optimum size for an inductance-tuning transistor 408, such that the range of characteristic impedance $Z_0$ is low. Block 610 finds how the range of $Z_0$ changes with the size of the inductance tuning transistor and selects a value that minimizes the range. This may be accomplished analytically or by simulating different sizes for transistor 408 and determining a size that results in the maximum and minimum impedance values being as close to one another as possible.

Once such circuits have been simulated, block 612 determines the tuning range of the simulated circuits. This range may be calculated as set forth above using the determined capacitances and inductances or by any other appropriate method. Block 614 tests whether the range of the simulated circuits is within the target range. If so, processing ends—if not block 616 changes the physical dimension limits and processing starts over at block 604.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 7:
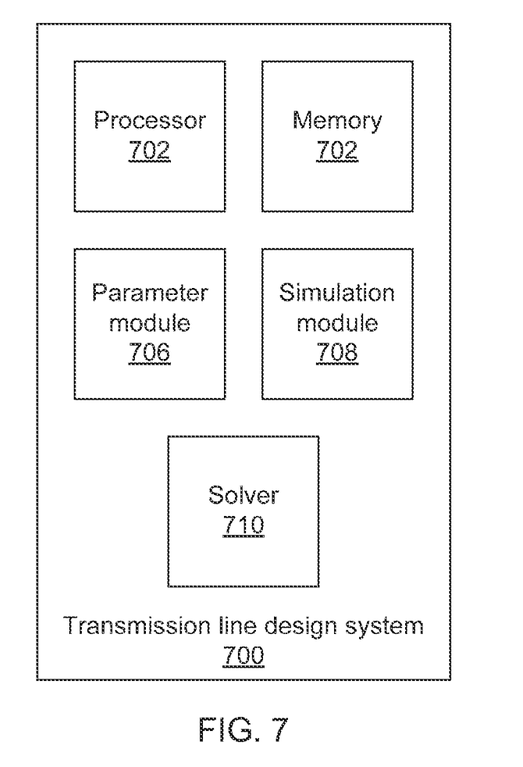
FIG. 7 is a diagram of a system for designing a tunable transmission line phase shifter in accordance with the present principles.

Referring now to FIG. 7, a transmission line design system 700 is shown. The system includes a processor 702 and memory 704. A parameter module 706 uses the processor 702 to generate parameters for a tunable transmission line design. The parameter module 706 may further use field solver 710 to determine values for these parameters and stores them in memory 704. Circuit simulation module 708 generates test circuit simulations using the generated parameters and tests them according to one or more performance rules. If the test circuit simulations do not meet the performance rules, then parameter module 706 generates a new set of parameters and starts over.

Figure 8:
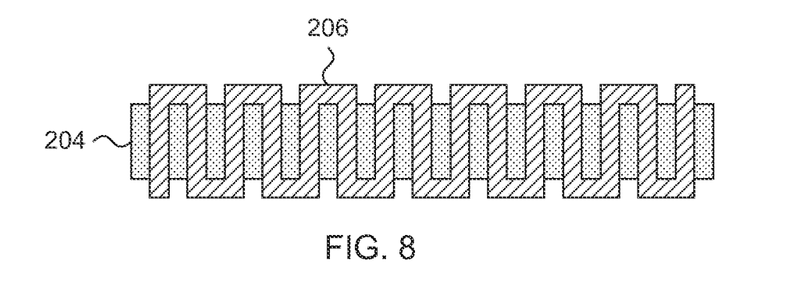
FIG. 8 is a bottom-up view of a crossing line and a signal line in a tunable transmission line phase shifter in accordance with the present principles.

Referring now to FIG. 8, a diagram of signal line 204 and conditional capacitance crossing lines 206 is shown from below. In this configuration, the crossing lines 206 are formed from a single, continuous line that winds under the signal line 204 in a "serpentine" configuration, which diminishes the inductive contribution that would result from using a straight line. The crossing line extensions 218 may be electrically connected to the crossing lines 206 in the areas where the crossing lines 206 extend beyond the sides of the signal line 204.

Figure 9:
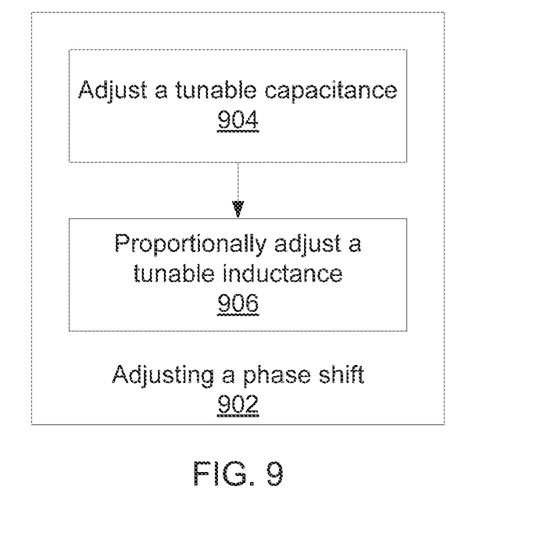
FIG. 9 is a block/flow diagram of a method for adjusting a tunable transmission line phase shifter in accordance with the present principles.

Referring now to FIG. 9, a method 902 for tuning the phase shift of a tunable transmission line phase shifter is shown. Block 904 tunes the capacitance of the phase shifter as described above by, e.g., applying a voltage to the capacitance tuning transistor 410. Block 906 tunes the inductance of the phase shifter by, e.g., applying a voltage to the inductance tuning transistor 408, making certain that the inductance is adjusted by an amount proportional to the change in the capacitance. The resulting phase change is based on the square root of product of the capacitance and the inductance, while changing the two in proportion prevents the characteristic impedance from changing significantly.

Having described preferred embodiments of a system and method for mmWave phase shifters using tunable transmission lines and the design thereof (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A tunable phase shifter, comprising:
   a signal line;
   one or more grounding lines;
   one or more crossing lines below the signal line in proximity to the signal line and substantially perpendicular to a longitudinal direction of the signal line, wherein the crossing lines conform to the shape of the signal line along at least three surfaces of the signal line and wherein the crossing lines have a tunable capacitance; and
   an inductance return line below all of the one or more crossing lines substantially parallel to the longitudinal direction of the signal line, wherein the inductance return line provides a tunable inductance.

2. The tunable phase shifter of claim 1, wherein the tunable phase shifter has a characteristic impedance variation of about zero.

3. The tunable phase shifter line of claim 1, wherein the one or more crossing lines comprise a tuning transistor configured to adjust a transistor capacitance.

4. The tunable phase shifter line of claim 3, wherein a capacitance between the signal line and the one or more crossing lines is at least twice the transistor capacitance.

5. The tunable phase shifter line of claim 1, wherein the inductance return line comprises a tuning transistor configured to tune an inductance between the one or more grounding lines, the signal line, and the inductance return line.

6. The tunable phase shifter line of claim 1, wherein the one or more crossing lines comprise a single conductor in a serpentine configuration below the signal line.

7. The tunable phase shifter line of claim 1, further comprising at least one conductive extension to the signal line.

8. The tunable phase shifter line of claim 7, wherein the crossing line conforms to the shape of the conductive extension and to the signal line.

9. The tunable phase shifter line of claim 7, wherein the at least one conductive extension extends below the signal line, each forming a ridge that increases capacitative surface area.

10. The tunable phase shifter line of claim 7, wherein the at least one conductive extension extends laterally from the signal line.

11. The tunable phase shifter line of claim 10, wherein the at least one conductive extension interdigitates with lateral extensions of the one or more crossing lines.

12. The tunable phase shifter of claim 1, wherein the one or more crossing lines closely conform to the shape of the signal line along at least three surfaces of the signal line in order to increase an associated capacitance.

13. A method for adjusting the phase shift of a tunable transmission line phase shifter, comprising:
adjusting a tunable capacitance of crossing lines that conform to a shape of a signal line along at least three surfaces of the signal line; and
adjusting a tunable inductance of an inductance return line in an amount proportional to the tunable capacitance, said inductance return line being positioned below all of the crossing lines and substantially parallel to the longitudinal direction of the signal line,
wherein adjusting the tunable capacitance and tunable inductance creates a target phase change and a change in a characteristic impedance of the tunable transmission line phase shifter of about zero.

14. The method of claim 13, wherein adjusting the tunable capacitance comprises applying a voltage to a capacitance tuning transistor.

15. The method of claim 13, wherein adjusting the tunable inductance comprises applying a voltage to an inductance tuning transistor.

16. The method of claim 13, wherein the crossing lines closely conform to the shape of the signal line along at least three surfaces of the signal line in order to increase an associated capacitance.

* * * * *